United States Patent
Aspar et al.

(10) Patent No.: US 8,268,703 B2
(45) Date of Patent: Sep. 18, 2012

(54) SURFACE ROUGHENING PROCESS

(75) Inventors: Bernard Aspar, Rives (FR); Chrystelle Lagahe Blanchard, Saint Joseph de Riviere (FR); Nicolas Sousbie, Grenoble (FR)

(73) Assignee: S.O.I.TEC Silicon on Insulator Technologies, Bernin (FR)

( * ) Notice: Subject to any disclaimer, the term of this patent is extended or adjusted under 35 U.S.C. 154(b) by 131 days.

(21) Appl. No.: 11/827,709

(22) Filed: Jul. 13, 2007

(65) Prior Publication Data

US 2008/0176381 A1    Jul. 24, 2008

(30) Foreign Application Priority Data

Jan. 22, 2007    (FR) ...................................... 07 52805

(51) Int. Cl.
    *H01L 21/30*    (2006.01)
(52) U.S. Cl. ........ 438/459; 438/424; 438/426; 438/438; 257/315; 257/316; 257/317; 257/E21.013
(58) Field of Classification Search .................. 438/459, 438/665, 770, 758, 424, 426, 108, 455, 398, 438/594; 257/E21.211, E21.476, E21.013, 257/E21.012, E21.068, 315–317
See application file for complete search history.

(56) References Cited

U.S. PATENT DOCUMENTS

| | | | |
|---|---|---|---|
| 5,882,538 A * | 3/1999 | Martin et al. | 216/71 |
| 6,146,979 A | 11/2000 | Henley et al. | |
| 6,962,882 B2 * | 11/2005 | Nozaki et al. | 438/787 |
| 6,974,759 B2 * | 12/2005 | Moriceau et al. | 438/459 |
| 2004/0115883 A1 * | 6/2004 | Iwata et al. | 438/257 |
| 2005/0048738 A1 | 3/2005 | Shaheen et al. | |
| 2005/0214485 A1 * | 9/2005 | Ide et al. | 428/32.38 |
| 2006/0281212 A1 * | 12/2006 | Moriceau et al. | 438/48 |
| 2006/0281234 A1 * | 12/2006 | Sugiyama et al. | 438/151 |
| 2007/0020947 A1 * | 1/2007 | Daval et al. | 438/758 |

FOREIGN PATENT DOCUMENTS

| | | |
|---|---|---|
| EP | 1 156 531 A1 | 11/2001 |
| EP | 1 638 141 A1 | 3/2006 |
| FR | 2 857 953 A | 1/2005 |
| JP | 02245041 * | 9/1990 |
| KR | 2004 0058477 A | 7/2004 |

OTHER PUBLICATIONS

Liu, Q., et al., "Si/SiO2 interface studies by spectroscopic immersion ellipsometry and atomic force microscopy", Journal of Vacuum Science & Technology A (Vacuum, Surfaces, and Films), vol. 12, No. 5, Sep./Oct. 1994, pp. 2625-2629.

(Continued)

*Primary Examiner* — Evan Pert
*Assistant Examiner* — Mark A Laurenzi
(74) *Attorney, Agent, or Firm* — Edwards Wildman Palmer LLP; George W. Neuner; George N. Chaclas

(57) ABSTRACT

A process of forming a rough interface in a semiconductor substrate. The process includes the steps of depositing a material on a surface of the substrate, forming a zone of irregularities in the material, and forming a rough interface in the semiconductor substrate by a thermal oxidation of the material and a part of the substrate. Additionally, the surface of the oxidized material may be prepared and the surface may be assembled with a second substrate.

20 Claims, 3 Drawing Sheets

OTHER PUBLICATIONS

L. Lai et al., "A study of the relationship between Si/SiO$_2$ between interface charges and roughness", Journal of Vacuum Science & Technology B: Microelectronics Processing and Phenomena, American Vacuum Society, New York, New York, vol. 17, No. 1, Jan. 1999, pp. 53-59.

L. Lai et al., "Limiting Si/SiO$_2$ interface roughness resulting from thermal oxidation", Journal of Applied Physics, American Institute of Physics. New York, New York, vol. 86, No. 3, Aug. 1, 1999, pp. 1729-17735.

French Search Report dated May 22, 2007.
French Search Report dated Nov. 1, 2007.

\* cited by examiner

SURFACE ROUGHENING PROCESS

CROSS REFERENCE TO RELATED APPLICATION

This application claims priority to French Patent Application No. FR0752805, filed Jan. 22, 2007, the contents of which are incorporated herein by reference.

BACKGROUND OF THE INVENTION

1. Field of the Invention

The invention relates to the field of microstructure manufacturing as well as the treatment of substrates in semiconductor materials.

2. Background of the Related Art

In microelectronics, certain operations, such as bonding operations, require that the surfaces to be bonded are as smooth as possible. However, the manufacturing of certain devices, particularly devices implementing a membrane or mobile part, may necessitate having recourse to surfaces that face each other but that do not adhere to each other, to justly prevent ill-timed bondings of the membrane on the facing surface and to maintain mobility of the membrane.

French Patent No. FR 2857953 discloses a process for manufacturing Bonded Silicon on Insulator (BSOI) type structures in which a structured zone is made, thus preventing bonding to another surface. This type of structure finds application in the field of Micro-Electro-Mechanical Systems (MEMS) generally, and more particularly in the case where a superficial silicon membrane must be released to manufacture sensors.

During the membrane release step, which may include an underlying oxide attack, the membrane may bond to the substrate, which may cause the sensor to malfunction. This bonding may also happen during operation of the sensor.

As explained in the document cited above, a BSOI substrate that comprises a rough buried interface avoids this problem since the roughness of the buried interface prevents any bonding between the membrane and the support.

French Patent No. FR 2857953 discloses roughening of a surface using various techniques, such as mechanical and/or chemical thinning (mechanical-chemical polishing, grinding, TMAH or HF/HNO$_3$ etching). These techniques may create defects on the surface of the semiconductor substrate (and even in the depth of the substrate in the case of grinding) that may generate defects on the specific BSOI antisticking substrate during manufacturing (for example bonding defects or structural defects in the SOI layer). In the case where the roughened substrate is thinned to become the active layer, these defects may interfere with the fabrication of certain types of components.

Roughening may also be accomplished by deposition of a non-monocrystalline material, which is different from the monocrystalline substrate. As a result of this process, the material deposited has physical properties that are different from those of the starting substrate, such as thermal and/or electrical conductivity properties. This difference in physical properties may interfere with certain applications.

Consequently, a process is needed that allows a rough surface to be made on a substrate without increasing the density of defects on the initial substrate and without modifying its main physical characteristics.

SUMMARY OF THE INVENTION

Advantages of the present invention will be set forth in and become apparent from the description that follows. Additional advantages of the invention will be realized and attained by the methods and systems particularly pointed out in the written description and claims hereof, as well as from the appended drawings.

To achieve these and other advantages and in accordance with the purpose of the invention, as embodied herein, the invention includes a process of forming a semiconductor substrate having a rough interface. The process includes the steps of depositing a material on a surface of the substrate, forming a zone of irregularities in the material, and forming a rough interface in the semiconductor substrate by a thermal oxidation of the material and a part of the substrate. Additionally, the surface of the oxidized material may be prepared and the surface may be assembled with a second substrate.

In one embodiment, the present invention allows a first monocrystalline semiconductor substrate with a roughened surface to be manufactured. The first roughened substrate is preferably a homogeneous material presenting a very low density of defects, and substantially identical to that of the starting substrate (monocrystalline Si for example). The first roughened substrate may then be used for making antisticking structures, that is, BSOI structures having a roughened buried interface.

In accordance with an other embodiment, the invention particularly relates to a process for forming a rough interface or topology in a semiconductor substrate. A zone of irregularities is accordingly formed on a surface of the substrate. The substrate is preferably a material that may be oxidized and/or that does not shield thermal oxidation. A rough interface is then formed in the semiconductor substrate by thermal oxidation of, or through, the material comprising the zone of irregularities and a part of the semiconductor substrate.

According to one aspect of the present invention, a material having a topology or roughness with an amplitude greater than the initial topology or roughness of the substrate surface is deposited or formed on a surface of the first substrate. Next a portion of the material comprising the relatively rougher surface and at least a part of the substrate may then be oxidized. The oxidation step may be a dry or wet oxidation step performed, for example, at temperatures between about 950° C. and about 1200° C. for time periods ranging from about 30 minutes to about 15 hours. The conditions of the oxidation step are adapted in such a way as to allow the material added on the first substrate to be oxidized. The oxidation front also preferentially reaches the substrate.

According to one exemplary embodiment, a homogeneous or heterogeneous layer is formed on the first substrate, this layer being rough and having a thickness d of between approximately 100 nm and approximately 1 μm. This layer is not an oxidation barrier. The substrate may be a semiconductor material such as silicon, and the layer may be a polycrystalline silicon.

The initial surface topology (or roughness of the material or layer formed on the surface of the first substrate) is then transferred to the substrate by oxidation of this material or this layer, or by oxidation through this material (if it is an oxide, for example).

The total consumption by oxidation of the layer deposited will allow defects, particularly crystalline defects, to be eliminated from the p-Si layer deposited. The oxidation front then reaches the initial substrate. Therefore with a superficial oxide (for example from the consumption of poly-Si material and part of the substrate) and an initial Si substrate (preferably monocrystalline) the density of defects is identical or comparable to that of the starting substrate. The oxide/silicon interface is rough, the surface roughness of the material deposited having been transferred during the advance of the oxidation front.

The oxide may then be withdrawn and a new oxide deposition or a new oxidation may be carried out on the rough surface of the substrate. The initial oxide or new oxide may therefore undergo mechanical-chemical polishing in the perspective of bonding by molecular adhesion. Assembly with another substrate having undergone treatment according to the invention or with an untreated bulk substrate may then be carried out. In both cases a part of the assembly (for example, one of the two substrates assembled) may then be treated, for example, by thinning. The roughness (or topology) may be formed by the deposition of a silicon oxide layer or a layer of polysilicon or amorphous silicon. Additionally, roughness or topology may be induced by the deposition of particles on the surface of the substrate.

It is to be understood that the foregoing general description and the following detailed description are exemplary and are intended to provide further explanation of the invention claimed.

The accompanying drawings, which are incorporated in and constitute part of this specification, are included to illustrate and provide a further understanding of the method and system of the invention. Together with the description, the drawings serve to explain principles of the invention.

DETAILED DISCLOSURE OF PARTICULAR EMBODIMENTS

Reference will now be made in detail to the present preferred embodiments of the invention, examples of which are illustrated in the accompanying drawings. The method and corresponding steps of the invention will be described in conjunction with the detailed description of the process.

The invention particularly relates to a process for forming a rough interface or topology in a semiconductor substrate comprising: the formation, on a surface of the substrate, of a zone of irregularities in a material (that may be oxidized and/or that does not shield thermal oxidation); and the formation of a rough interface in the semiconductor substrate by thermal oxidation of, or through, the material and a part of the semiconductor substrate.

Figure 1A:
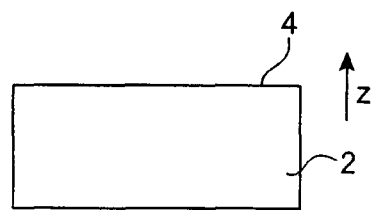
FIGS. 1A-1C represent a process for forming a rough interface in a semiconductor substrate in accordance with an embodiment of the invention.
Figure 1B:
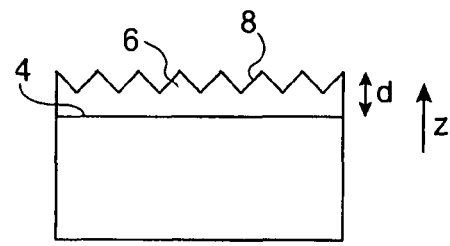

As shown in FIG. 1A, a substrate 2 is selected in a first semiconductor and monocrystalline material, whose surface 4 presents a roughness equal to R1. As shown in FIG. 1B, a second material 6 is then formed or deposited on the surface of substrate 2. The surface of this material presents a roughness R2 relative to the type of layer deposited and to the deposition technique utilized. This roughness R2 is greater than roughness R1 of substrate 2. The roughness is measured based on differences in altitude or levels (following an axis z perpendicular to the surface 4 of the substrate), between the high zones and low zones of the surface of the second material 6. The roughness presents an altitude profile wherein the maximum amplitude (for example a certain roughness) R2 is greater than roughness R1 of substrate 2, when the R1 and R2 are compared at the same frequency (high or low frequency).

Figure 1C:
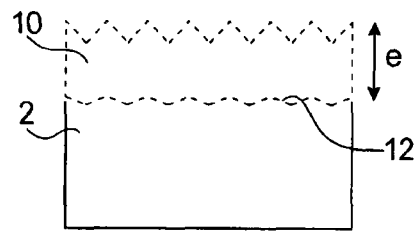
Figure 2A:
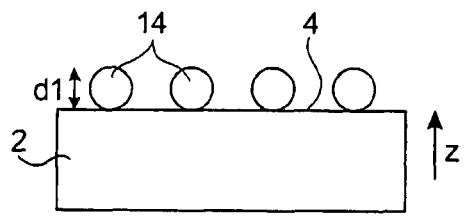
FIGS. 2A-2B and 3A-3B represent another embodiment of the invention.
Figure 3A:
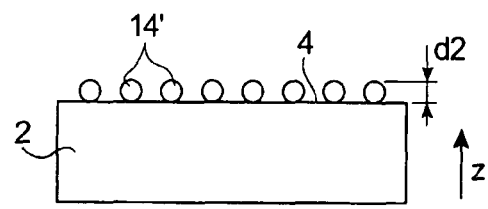
Figure 2B:
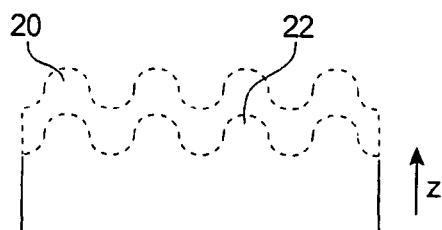
Figure 3B:
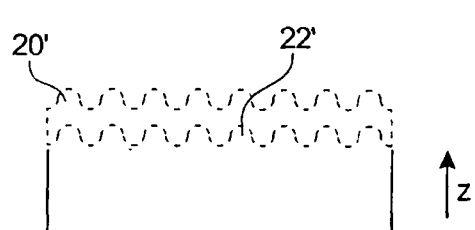

Next, thermal oxidation is performed. According to the nature of the second material 6, the oxidation front will oxidize it entirely, or cross it entirely (if it has already been oxidized), and at least partially transfer the topology and roughness profile to the initial bulk substrate 2. At the end of this oxidation, the topology or roughness of the second material 6, transferred in the substrate 2, will either be maintained or reduced but will remain greater than the initial roughness R1 of surface 4. As shown in FIG. 1C, this will have the consequence of generating a rough interface 12 between the thermal oxide 10 generated by thermal oxidation and the substrate 2.

If the layer is not initially an oxide, the layer 6, deposited on substrate 2 and possibly part of the substrate, will have been entirely transformed during oxidation. If layer 6 is an oxide (it is for example silicon oxide), oxidation will have transferred the roughness or topology of the surface in substrate 2, part of the latter being, in addition, oxidized.

According to an exemplary embodiment of the invention illustrated in FIGS. 1A-1C, a starting substrate 2, for example in silicon, is selected. A deposition 6 is formed on the surface 4 of substrate 2. This deposition may be, for example, polysilicon or amorphous silicon. The roughness R2 of this deposition 6 is adapted for making "antisticking" structures and is on the order of several nm of AFM RMS, for example between approximately 1 nm and approximately 10 nm, even for 5 μm×5 μm scan windows.

Next, an oxidation step is performed. In the case of the deposition of a layer 6 in polycrystalline or amorphous silicon, a thickness e of thermal oxide 10 is preferably formed (FIG. 1C) such that e is greater than or equal to about (d/0.44), where d is the thickness of the initial layer 6. Thickness e corresponds to the thermal oxide 10 thickness allowing all of layer 6 deposited on surface 4 to be oxidized.

At the end of this oxidation step, the oxidation front 12 or oxide-substrate interface is substantially at a depth of d/0.44 under surface 8, or in the substrate 2 itself (therefore at a depth, under surface 8, that is greater than d/0.44).

This front or interface has a final topology or surface roughness R3 equal to or substantially less than R2, but greater than R1. This roughness R3 is sufficient so that, if a membrane is positioned facing this roughness surface R3 and comes in contact with the surface, adhesion of the membrane on the surface cannot be achieved, thus preventing the mobility of the membrane from being obstructed.

The roughness R3 of interface 12 may be adjusted by adjusting the thickness d of the deposited material 6. When the thickness of deposited material 6 is large, the roughness of surface R2 is increased. In addition, generation of thermal oxide with higher thickness tends to reduce roughness before the oxidation front. Therefore, by exploiting the thickness d of deposition 6 and the oxidation thickness, it is possible to control the final roughness R3 of the buried interface 12, for example, an oxide/silicon interface. These considerations remain valid if layer 6 is already an oxide layer.

The thickness d of layer 6 may vary by several or dozens of nm to several μm, for example from approximately 5 nm to approximately 3 μm. In one exemplary embodiment, the material is polycrystalline silicon with a thickness d=400 nm, the thermal oxide has a thickness e=1.2 μm, the oxidation process is carried out at a temperature of 1100° C., and the final roughness of the buried interface is approximately 3 nm RMS, in a scan of 5×5 μm.

According to another embodiment of the invention, illustrated in FIGS. 2A, 2B, and 3A, 3B, a deposit of beads or particles (not necessarily of spherical form) 14, 14' in silica or silicon for example is made on the surface of substrate 2. These beads will form a topology in the sense already explained above on the surface of this substrate 2. The amplitude of this topology is defined by the diameter of the beads or particles deposited measured according to the axis z (perpendicular to the surface 4 of substrate 2). The particles from FIG. 2A have a diameter d1; those of FIG. 3A have a diameter d2 that is less than d1.

During the oxidation step, an irregular oxidation front will be generated, which will again have the consequence of forming a rough interface 22, 22' or substantially reproducing the initial topology formed by beads or particles 14, 14'. This interface is the oxide/silicon type in the example of substrate 2 in silicon and particles 14, 14' initially in silicon.

The roughness or amplitude of the topology of interface 22, 22' depends on the maximum dimension, measured following axis z of deposited particles 14, 14' (the dimensions of these particles may go from several dozen nm to several μm, for example from approximately 10 nm or approximately 20 nm to approximately 1 μm or approximately 10 μm) and the thickness of the thermal oxide 20, 20'. In fact, the thicker this oxide, the more the roughness or amplitude of the topology of the interface 22, 22' is reduced.

Therefore, roughnesses and/or topologies that are both high and/or low frequencies may be generated (these frequencies are spatial frequencies of the distribution of irregularities at the substrate surface) according to the density and size of the particles 14, 14' deposited. In the case of particles of Si, a thermal oxide thickness greater than or equal to (d1/0.44) or (d2/0.44) allows almost all of the particles to be consumed, where d1 and d2 correspond to the diameter or to the maximum size of the largest particle.

The roughness R1 may be evaluated in the high frequency domain, as known in the art. For example, such a measurement may be obtained correctly by directly observing a small portion of the surface under atomic force microscopy (AFM), such as on a 5×5 μm² sample (or a 10×10 μm² sample or a 30×30 μm² sample, among others). The peaks may accordingly be evaluated quantitatively, under direct observation.

The roughness may also be evaluated in the low frequency domain, as known in the art. This low frequency roughness measures the variation of the planarity of the surface from a first point to a second point on the surface, such as by using a profilometer. For example, such a measurement may be obtained by using such a mechanical surface roughness measuring instrument with a 2 μm tip and by performing one or more 500 μm scans.

This technique also allows inhomogeneities in the concentration and size of particles 14, 14' to be created on the wafer, thereby allowing different types of roughnesses and/or topologies to be formed on the same wafer: to do this particles 14, 14' with varied diameters are deposited, for example particles with a diameter d1 and particles with a diameter d2 that is less than d1.

Two other embodiments will be explained in connection with FIGS. 4A-4C. According to one of these embodiments of the invention, a rough deposition 36 of oxide or nitride is made. In one exemplary embodiment, the rough deposition 36 is made on substrate 2 using Low-Pressure Chemical Vapor Deposition (LPCVD) or Plasma-Enhanced Chemical Vapor Deposition (PECVD) techniques.

Figure 4A:
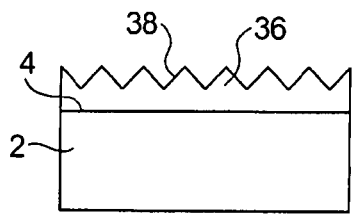
FIGS. 4A-4C illustrate two other embodiments of the invention.
Figure 4B:
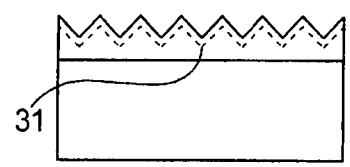
Figure 4C:
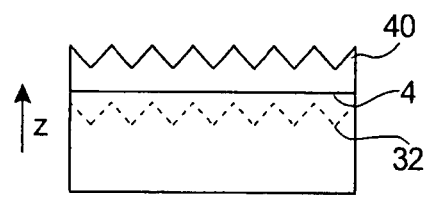

The roughness R2 of surface 38 of this deposition is greater than roughness R1 of the initial surface 4 of substrate 2 (FIG. 4A). During thermal oxidation, an irregular oxidation front 31 is produced (FIG. 4B), as in the other cases explained above. The irregular character is due to the surface roughness of the layer 36 deposited. A buried rough interface 32 is also formed, having a roughness R3, close to R2, more particularly slightly less than R2. The duration of the oxidation step is such that the oxidation front at least reaches the initial substrate 2 and possibly progresses in substrate 2, beyond its initial surface 4 (FIG. 4C).

In the case of oxide layer 36, it is crossed by the oxidation front which thereby at least partially oxidizes the substrate. The oxidation will allow the transfer of the roughness of surface 38 to the substrate.

According to yet another embodiment of the invention, it is possible to make a layer 36 in oxide (for example by PECVD, LPCVD or thermal oxidation) or in nitride (for example by PECVD or LPCVD), then to roughen the layer or to increase the roughness of this layer by HF attack (the concentration of this may vary from 1% to 49%) or with $H_3PO_4$ (orthophosphoric acid) for SiN. This attack is stopped before reaching substrate 2.

If a second oxidation is carried out after the roughening step, the irregular oxidation front will be transferred in substrate 2. Here also, the thermal oxide thickness 40 (FIG. 4C) formed will be such that the oxidation front crosses interface 4 and penetrates in substrate 2. The roughness of interface 32 may be adapted by varying on the one hand the parameters (time, concentration) of the HF attack (this will exploit the initial roughness of surface 38) and on the other hand the thickness of oxide 40 resulting from the oxidation step.

A substrate obtained by a process according to the invention comprises a buried interface 12, 22, 22', 32 with a chosen roughness or having a topology similar to the topology created initially, and may be utilized for different applications.

In particular, it may be employed for the manufacture of antisticking BSOI substrates, in "superior" substrate and/or support. The material layer 10, 20, 20', 40 may be eliminated, therefore leaving the oxidation front 12, 22, 22', 32 exposed at the desired roughness R2. A new thermal oxidation step may be carried out to generate very high quality silicon oxide. The oxidized substrate may be bonded to the rough interface. Preparing the surface is then recommended.

Figure 5A:
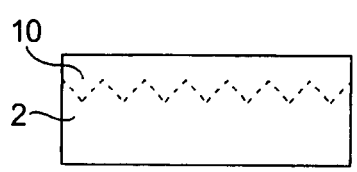
FIGS. 5A and 5B represent the assembly of a substrate formed according to an embodiment of the invention, with another substrate.
Figure 6A:
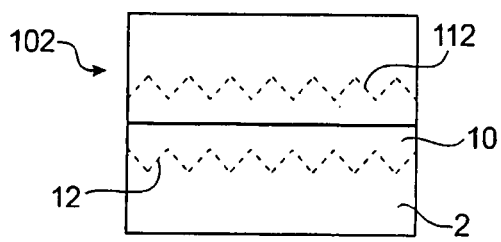
FIGS. 6A and 6B represent the assembly of two substrates according to an embodiment of the invention.
Figure 6B:
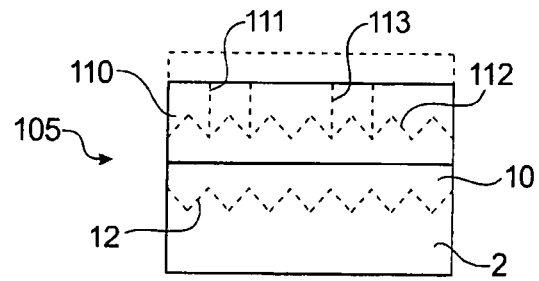

As illustrated in FIG. 5A, a mechanical chemical polishing step may be performed in order to restore good surface roughness (that is, a roughness adapted to direct bonding) of the oxide layer 10 (FIGS. 5A, 6A, and 6B, represent the layer 10 by way of example, but other layers 20, 20', 40, 60 are also affected).

Figure 5B:
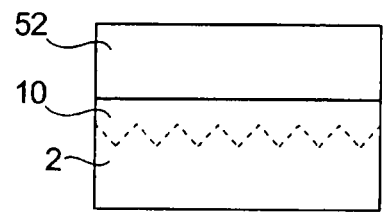

As illustrated in FIG. 5B, bonding, for example direct bonding by molecular adhesion, may then be performed on a second substrate 52, for example bulk silicon. This second substrate 52 or the first substrate may then be thinned. Any suitable thinning technique may be implemented, for example by a mechanical, chemical or mechanical-chemical technique or the "Smart Cut™" process. Direct bonding may then be carried out on a second substrate 102, itself also having a rough buried interface 112 (FIG. 6A). This substrate is preferably obtained according to one of the processes described above.

The assembled structure may then undergo thermal treatment to reinforce the bonding interface and one or more thinning steps until a Silicon on Insulator (SOI) structure 105 is obtained, comprising one or two rough oxide/silicon interfaces. FIG. 6B represents such a structure with two rough interfaces 12, 112 and one residual layer 110 of the second substrate.

During the production of integrated sensor membranes or mobile parts, part of the oxide 10 may be locally removed by etching through openings 111, 113 made in the residual layer 110. Cavities may then be locally created under membranes. The rough interface 112 prevents ill-timed bonding or adherence of the membrane on the substrate 2.

Figure 7:
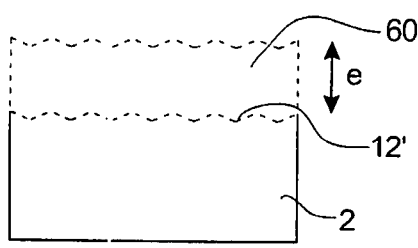
FIG. 7 represents a substrate according to an embodiment of the invention in which the oxide layer was eliminated and then replaced by another oxide layer.

Another utilization of a substrate according to the invention is illustrated in FIG. 7: the oxide 10, 20, 20', 40 may be replaced with an oxide layer 60 if the first layer (for example, layer 10) was not homogeneous enough. To do this, one may carry out a desoxidation step with an HF (hydrofluoric acid) solution, followed by a thermal oxidation step of substrate 2, thereby generating the oxide layer 60. The interface 12' thereby generated has a roughness that is less than or equal to that of the rough interface 12, of roughness R3, obtained after the first oxidation.

One advantage of a manufacturing process according to the invention is the flexibility of obtaining a rough oxide/silicon interface: the roughness frequency ranges that may be reached are large, while a substrate is kept in a crystalline material and free of defects.

Another advantage of the manufacturing processes described is that the layer 6, 14, 36 of irregularities utilized is totally oxidized during the oxide generation step that will transfer the roughness or topology. This allows BSOI structures to be made without insert material (only monocrystalline silicon and oxide). The different embodiments disclosed may be used individually, successively or even combined.

The examples given above implement a silicon substrate or substrates. But the invention may be applied to all semiconductor substrates that can be oxidized, particularly: monocrystalline Si, polycrystalline Si, amorphous Si, and SiC.

Constructing a rough buried interface according to the invention is especially interesting for manufacturing an "anti-sticking" BSOI type substrate, the application described for example in French Patent No. FR 2857953.

In a process according to the invention, the roughness obtained may be inspected for example by measuring haze on TENCOR 6200 (surfscan) type equipment. This parameter provides information on the surface roughness on the totality of the substrate surface ("full wafer" mapping), as explained in the article by F. Holsteyns et al., "Seeing through the haze, Process monitoring and qualification using comprehensive surface data," published in Yield Management Solutions, Spring 2004, pp. 50-54. The roughness may also be inspected by AFM (atomic force microscope) measurement on scans typically ranging from 1 $\mu m^2$ to 10000 $\mu m^2$.

Figure 8:
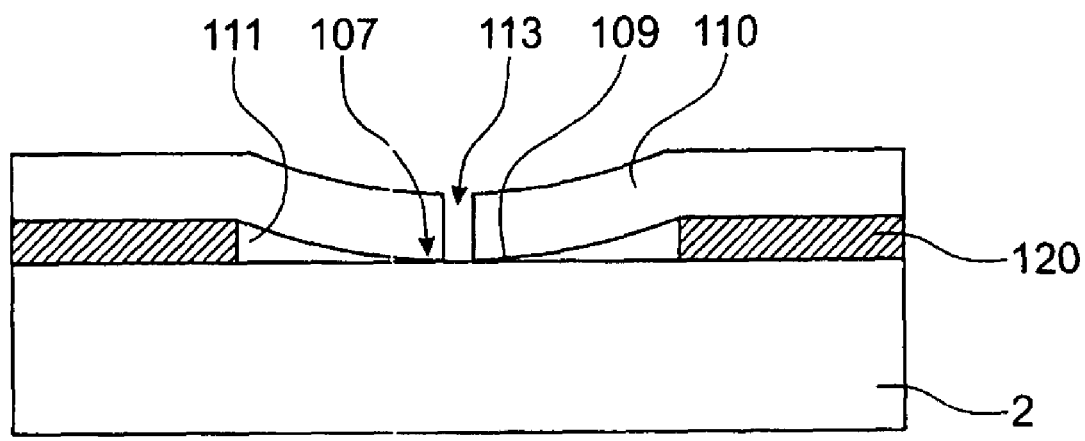
FIGS. 8 and 9 represent devices without roughness (FIG. 8) and the corresponding bonding problems, and with roughness (FIG. 9).
Figure 9:
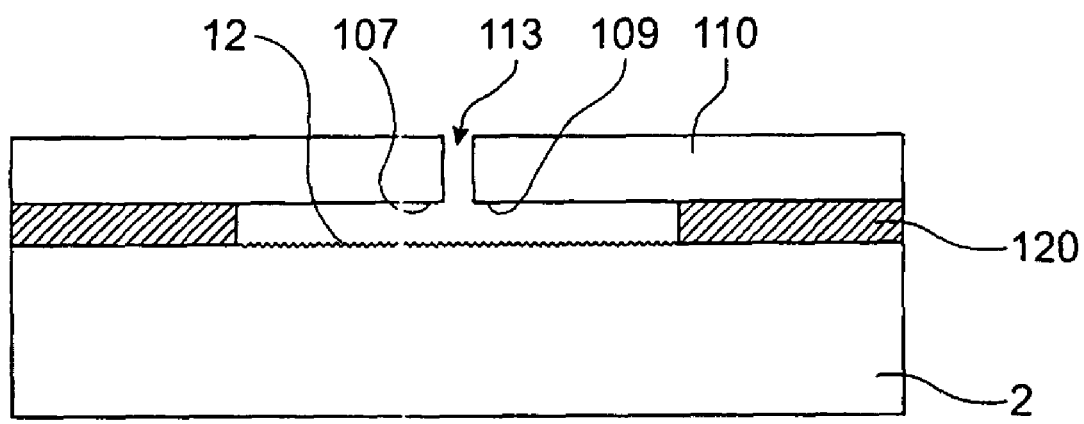

FIGS. 8 and 9 illustrate the differences in behavior between a device without a rough interface and a device with a rough interface. In FIG. 8, a membrane 110 was obtained by etching a cavity 111 in a layer 120 of oxide through an opening 113. The assembly remains on a support 2 in a semiconductor material (silicon for example). The zones 107 and 109 of the membrane 110 may adhere to the upper surface of the substrate 2 during etching of the underlying oxide, or later, during deformations of this membrane linked to the operation of the finished component.

FIG. 9 illustrates a device according to the invention, in which the upper face 12 of the substrate 2 comprises a roughness obtained by a process according to the invention, for example such as explained above in connection with FIG. 6B. These roughnesses will prevent zones 107 and 109 of membrane 110 from adhering to the upper surface 12 of substrate 2.

In a variation, this may be the lower face 112 of membrane 110 that comprises a roughness obtained by a process according to the invention, for example such as explained above in connection with FIG. 6B. This roughness prevents zones 107 and 109 of membrane 110 from adhering to the upper surface 12 of substrate 2.

The process as described above and shown in the drawings provides for the forming of a rough interface or topology in a semiconductor substrate.

It will be apparent to those skilled in the art that various modifications and variations can be made to the embodiments of the present invention without departing from the scope of the invention. Thus, it is intended that the present invention include modifications and variations that are within the scope of the appended claims and their equivalents.

What is claimed is:

1. A process of forming a rough interface in a semiconductor substrate, the process comprising:
    a) forming a zone of irregularities by depositing a layer of material directly on a smooth semiconductor substrate surface of the semiconductor substrate, wherein the layer has an upper surface with a rough topology; and
    b) after step a), forming a rough oxide-substrate interface within the semiconductor substrate between the layer and the smooth semiconductor surface by thermally oxidizing the layer of material and a part of the semiconductor substrate to at least partially transfer the rough topology of the layer to the formerly smooth semiconductor substrate surface.

2. The process according to claim 1, wherein the semiconductor substrate surface has a second roughness that is greater than an initial roughness of the semiconductor surface of the substrate.

3. The process according to claim 2, wherein the deposited material has an initial thickness ranging from approximately 10 nm to approximately 3 $\mu$m.

4. The process according to claim 2, wherein the second roughness is between approximately 1 nm RMS and approximately 10 nm RMS.

5. The process according to claim 2, wherein the second roughness is formed by chemical attack of the layer of material, wherein the chemical attack does not reach the semiconductor substrate.

6. The process according to claim 1, wherein the material on which the zone of irregularities is formed is a material selected from the group consisting of polysilicon, amorphous silicon, silicon oxide, silicon nitride, and combinations thereof.

7. The process according to claim 5, wherein the chemical attack is selected from the group consisting of an HF attack and an $H_3PO_4$ attack.

8. The process according to claim 5, wherein the layer of material is at least one of a thermal oxide and a thermal nitride.

9. The process according to claim 1, wherein the zone of irregularities is formed by a plurality of particles deposited on the semiconductor surface of the semiconductor substrate.

10. The process according to claim 9, wherein the plurality of particles have an average dimension from about 10 nm to about 10 $\mu$m, as measured following an axis perpendicular to the semiconductor substrate.

11. The process according to claim 1, wherein the thermal oxidation step is performed at a temperature between approximately 950° C. and approximately 1200° C.

12. The process according to claim 1, further comprising: eliminating the oxide layer formed by the oxidation step; and forming a new thermal oxide layer.

13. The process according to claim 1, wherein the semiconductor substrate is at least one of a monocrystalline substrate, a polycrystalline substrate, an amorphous silicon substrate, and a SiC substrate.

14. A process of forming a semiconductor component with a buried rough interface, the process comprising:
   a) depositing material directly on a semiconductor substrate surface of a first semiconductor substrate, wherein the semiconductor substrate surface has an initial roughness;
   b) forming a zone of irregularities on the material such that a surface opposing the semiconductor substrate surface has a rough topology;
   c) after steps a) and b), forming a rough oxide-substrate interface within the first semiconductor substrate between the material and the semiconductor substrate surface by a thermal oxidation of the material and a part of the first semiconductor substrate to at least partially transfer the rough topology of the material to the semiconductor substrate surface to create a subsequent roughness that is greater than the initial roughness;
   d) preparing the semiconductor substrate surface of the oxidized material;
   e) assembling the semiconductor substrate surface of the oxidized material with a second substrate.

15. The process according to claim 14, wherein the second substrate is a raw or bulk substrate.

16. The process according to claim 14, wherein the second substrate is prepared by:
   a) depositing a layer of a second material on a surface of the second substrate;
   b) forming a zone of irregularities on the second material; and
   c) forming a rough oxide-substrate interface within the second substrate by a thermal oxidation of the second material and a part of the second substrate.

17. The process according to claim 16, wherein the second substrate is at least one of a monocrystalline substrate, a polycrystalline substrate, an amorphous silicon substrate, and a SiC substrate.

18. The process according to claim 14, wherein at least one of the two substrates is thinned.

19. The process according to claim 14 further comprising eliminating at least a portion of the oxidized material.

20. The process according to claim 19, wherein the elimination of a portion of the oxidized material is accomplished by etching through at least one opening made in one of the two substrates.

* * * * *